US00RE51107E

(19) United States
(12) Reissued Patent
De Jager

(10) Patent Number: US RE51,107 E
(45) Date of Reissued Patent: Nov. 3, 2026

(54) MULTI-BEAM INSPECTION METHODS AND SYSTEMS

(71) Applicant: ASML NETHERLANDS B.V., Veldhoven (NL)

(72) Inventor: Pieter Willem Herman De Jager, Middelbeers (NL)

(73) Assignee: ASML NETHERLANDS, Veldhoven (NL)

(21) Appl. No.: 18/904,066

(22) Filed: Oct. 1, 2024

Related U.S. Patent Documents

Reissue of:
(64) Patent No.: 11,462,380
Issued: Oct. 4, 2022
Appl. No.: 17/266,792
PCT Filed: Jul. 3, 2019
PCT No.: PCT/EP2019/067882
§ 371 (c)(1),
(2) Date: Feb. 8, 2021
PCT Pub. No.: WO2020/043367
PCT Pub. Date: Mar. 5, 2020

(30) Foreign Application Priority Data

Aug. 28, 2018 (EP) ..... 18191043

(51) Int. Cl.
*H01J 37/153* (2006.01)
*H01J 37/10* (2006.01)
(Continued)

(52) U.S. Cl.
CPC ..... *H01J 37/153* (2013.01); *H01J 37/10* (2013.01); *H01J 37/1474* (2013.01);
(Continued)

(58) Field of Classification Search
CPC ..... H01J 37/28; H01J 37/20; H01J 37/1474; H01J 37/10; H01J 37/153
See application file for complete search history.

(56) References Cited

U.S. PATENT DOCUMENTS 9,035,249 B1 * 5/2015 Frosien ..... H01J 37/244 250/311
2006/0169910 A1 8/2006 Frosien et al.
(Continued)

FOREIGN PATENT DOCUMENTS

TW 201830148 8/2018

OTHER PUBLICATIONS

International Search Report and Written Opinion issued in corresponding PCT Patent Application No. PCT/EP2019/067882, dated Dec. 3, 2019.

(Continued)

*Primary Examiner* — Christina Y. Leung
(74) *Attorney, Agent, or Firm* — Pillsbury Winthrop Shaw Pittman, LLP

(57) ABSTRACT

Systems, methods, and programming are described for inspecting a substrate having a pattern imaged thereon, including obtaining a plurality of selected target locations on the substrate, the selected target locations dependent on characteristics of the pattern, scanning the substrate with a plurality of electron beamlets, wherein the scanning includes individually addressing the beamlets to impinge on the selected target locations independently, detecting a reflected or a transmitted portion of the beamlets, and generating images of the selected target locations.

23 Claims, 9 Drawing Sheets

(51) Int. Cl.
*H01J 37/147* (2006.01)
*H01J 37/20* (2006.01)
*H01J 37/28* (2006.01)

(52) U.S. Cl.
CPC ..... *H01J 37/20* (2013.01); *H01J 37/28* (2013.01); *H01J 2237/1205* (2013.01); *H01J 2237/1534* (2013.01); *H01J 2237/202* (2013.01); *H01J 2237/2817* (2013.01)

(56) References Cited

U.S. PATENT DOCUMENTS

| | | | | |
|---|---|---|---|---|
| 2006/0237659 | A1 | 10/2006 | Feuerbaum et al. | H01J 37/3177 250/396 ML |
| 2008/0067376 | A1* | 3/2008 | Tanimoto | H02N 13/00 250/310 |
| 2014/0367586 | A1 | 12/2014 | Frosien et al. | |
| 2015/0155134 | A1* | 6/2015 | Frosien | H01J 37/1474 250/310 |
| 2017/0213688 | A1* | 7/2017 | Ren | H01J 37/06 |
| 2017/0229279 | A1 | 8/2017 | Brodie et al. | H01J 37/12 |
| 2017/0243717 | A1 | 8/2017 | Kruit | H01J 37/12 |

OTHER PUBLICATIONS

Taiwanese Office Action issued in corresponding Taiwanese Patent Application No. 108126729, dated Sep. 8, 2020.

* cited by examiner

MULTI-BEAM INSPECTION METHODS AND SYSTEMS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application is the U.S. national phase entry of PCT Patent Application No. PCT/EP2019/067882, which was filed on Jul. 3, 2019, which claims the benefit of priority of European Patent Application No. 18191043.1, which was filed on Aug. 28, 2018, and which is incorporated herein in its entirety by reference.

FIELD

The present description relates to methods of, and apparatuses for, determining information associated with a feature on an object prior to that object being scanned by a scanning electron microscope ("SEM").

BACKGROUND

In various steps of a semiconductor manufacturing process, pattern defects and/or uninvited particles can appear on a wafer and/or mask during the fabrication process, which can reduce the yield to a great degree. To meet the demand of resolution and reliability inspection brought by reducing the dimensions of semiconductor device, and to satisfy the demand of high throughput and high yield of the manufacturing process, multiple particle beams have been utilized in inspection systems to replace the previously employed Low voltage Scanning Electron Microscope (LVSEM) utilizing a single primary electron beam to inspect one single area of the surface of a sample object at one time. is a machine that applies a desired pattern onto a substrate, usually onto a target portion of the substrate.

SUMMARY

Manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching using the pattern using an etch apparatus, etc. Further, one or more metrology processes are typically involved in the patterning process.

Metrology processes are used at various steps during a patterning process to monitor and control the process. For example, metrology processes are used to measure one or more characteristics of a substrate, such as a relative location (e.g., registration, overlay, alignment, etc.) or parameter (e.g., line width, critical dimension (CD), thickness, etc.) of features formed on the substrate during the patterning process, such that, for example, the performance of the patterning process can be determined from the one or more characteristics. If the one or more characteristics are unacceptable (e.g., out of a predetermined range for the characteristic(s)), the measurements of the one or more characteristics may be used to alter one or more parameters of the patterning process such that further substrates manufactured by the patterning process have an acceptable characteristic(s).

With the advancement of lithography and other patterning process technologies, the dimensions of functional elements have continually been reduced while the amount of the functional elements, such as transistors, per device has been steadily increased over decades. In the meanwhile, the requirement of accuracy in terms of overlay, critical dimension (CD), etc., has become more and more stringent. Errors, such as overlay errors, CD errors, etc., will inevitably be produced in the patterning process. For example, imaging errors may be produced from optical aberration, patterning device heating, patterning device errors, and/or substrate heating and can be characterized in terms of, e.g., overlay errors, CD errors, etc. Additionally or alternatively, errors may be introduced in other parts of the patterning process, such as in etch, development, bake, etc., and similarly can be characterized in terms of, e.g., overlay errors, CD errors, etc. The errors may directly cause a problem in terms of the function of the device, including failure of the device to function or one or more electrical problems of the functioning device.

As noted above, in patterning processes, it is desirable to frequently make measurements of the structures created, e.g., for process control and verification. One or more parameters of the structures are typically measured or determined, for example, the critical dimension of a structure, the overlay error between successive layers formed in or on the substrate, etc. There are various techniques for making measurements of the microscopic structures formed in a patterning process. Various tools for making such measurements are known including, but not limited to, scanning electron microscopes (SEMs), which are often used to measure a parameter, such as critical dimension ("CD") and/or edge point ("EP"). SEMs have high resolving power and are capable of resolving features of the order of 30 nm or less, 20 nm or less, 10 nm or less, or 5 nm or less. SEM images of semiconductor devices are often used in the semiconductor fab to observe what is happening at the device level.

The measurement information (such as extracted from SEM images of device structures) can be used for process modeling, existing model calibration (including recalibration), defect detection, estimation, characterization or classification, yield estimation, process control or monitoring, etc.

In an aspect, there is provided a method of inspecting a substrate having a pattern imaged thereon, including obtaining a plurality of selected target locations on the substrate, the selected target locations dependent on characteristics of the pattern, scanning the substrate with a plurality of electron beamlets, wherein the scanning comprises individually addressing the beamlets to impinge on the selected target locations independently, detecting a reflected or a transmitted portion of the beamlets and generating images of the selected target locations.

In an aspect, there is provided a computing device including memory and at least one processor. The at least one processor may be operable to perform the method of inspecting.

In an aspect, there is provided a non-transitory computer readable medium including instructions that, when executed by at least one processor of a machine, cause the machine to perform the method of inspecting.

In an aspect, there is provide an apparatus for inspecting a substrate having a pattern thereon, including a source of a plurality of electron beamlets, a condenser lens, configured to receive the beamlets and reduce a divergence thereof, a scan deflector; configured and arranged to displace the beamlets as a group to scan a surface of the substrate, an objective lens, configured and arranged to focus the beamlets onto the surface of the substrate, an aberration correcting deflector, configured and arranged to controllably displace the beamlets in a radial direction to correct aberrations, a micro lens array, configured and arranged to controllably displace the beamlets in a focus direction to correct a field curvature, and an addressable deflector, configured and arranged to independently displace each beamlet to impinge on selected target locations.

In an aspect, there is provided an electron beam deflector having independently addressable electrodes including an array of apertures configured to allow passage of an electron beam therethrough, an array of electrodes, each electrode of the array positioned proximate a respective aperture, the electrodes configured and arranged to, when energized, produce an electric field for steering the electron beam passing through the aperture, a first set of electrical leads extending in a first direction across the array of electrodes, the first set of electrical leads being in electrical communication with an array of switches, the switches being controllable by energizing leads of the first set of electrical leads.

BRIEF DESCRIPTION OF THE DRAWINGS

Embodiments will now be described, by way of example only, with reference to the accompanying drawings in which.

DETAILED DESCRIPTION

Before describing embodiments in detail, it is instructive to present an example environment in which embodiments may be implemented.

Figure 1:
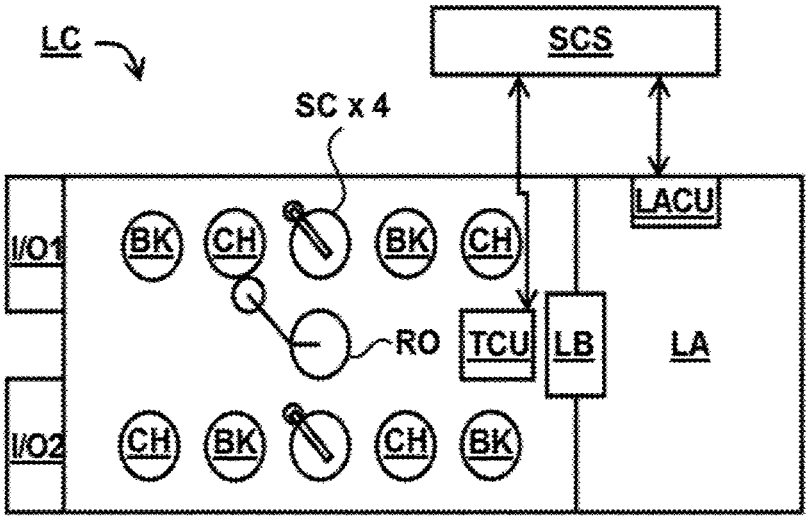
FIG. 1 is an illustrative diagram of an exemplary lithographic cell or cluster, in accordance with various embodiments.

FIG. 1 is an illustrative diagram of an exemplary lithographic cell or cluster, in accordance with various embodiments. As shown in FIG. 1, a lithographic apparatus LA may form part of a lithographic cell LC, also sometimes referred to as a lithocell or lithocluster, which also may include, in some embodiments, an apparatus to perform one or more pre- and post-pattern transfer processes on a substrate. Conventionally these include one or more spin coaters SC to deposit a resist layer, one or more developers DE to develop patterned resist, one or more chill plates CH, and one or more bake plates BK. A substrate handler, or robot, RO may pick up a substrate from input/output ports I/O1, I/O2, and may move it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

To enable that the substrate that is processed (e.g., exposed) by the patterning process is processed correctly and consistently, it is desirable to inspect a processed substrate to measure one or more properties such as overlay error between subsequent layers, line thickness, critical dimension (CD), etc. If an error is detected, an adjustment may be made to the patterning process, e.g., in terms of changing a design of, or changing a tool for designing, the patterning process, controlling an executing patterning process, etc.

An inspection apparatus can be used for such measurement. An inspection apparatus is used to determine one or more properties of a substrate, and in particular, how one or more properties of different substrates or different layers of the same substrate vary from layer to layer and/or across a substrate and/or across different substrates, e.g., from substrate to substrate. The inspection apparatus may be integrated into the lithographic apparatus LA or the lithocell LC or may be a stand-alone device.

An inspection apparatus to determine one or more properties of a substrate can take various different forms. For example, the inspection apparatus may use photon electromagnetic radiation to illuminate the substrate and detect radiation redirected by the substrate; such inspection apparatuses may be referred to as bright-field inspection apparatuses. A bright-field inspection apparatus may use radiation with a wavelength in, for example, the range of 150-900 nm. The inspection apparatus may be image-based, i.e., taking an image of the substrate, and/or diffraction-based, i.e., measuring intensity of diffracted radiation. The inspection apparatus may inspect product features (e.g., features of an integrated circuit to be formed using the substrate or features of a mask) and/or inspect specific measurement targets (e.g., overlay targets, focus/dose targets, CD gauge patterns, etc.).

Inspection of, e.g., semiconductor wafers is often done with optics-based sub-resolution tools (bright-field inspection). However, in some cases, certain features to be measured are too small to be effectively measured using bright-field inspection. For example, bright-field inspection of defects in features of a semiconductor device can be challenging. Moreover, as time progresses, features that are being made using patterning processes (e.g., semiconductor features made using lithography) are becoming smaller and in many cases, the density of features is also increasing. Accordingly, a higher resolution inspection technique is used and desired. An example inspection technique is electron beam inspection. Electron beam inspection involves focusing a beam of electrons on a small spot on the substrate to be inspected. An image is formed by providing relative movement between the beam and the substrate (hereinafter referred to as scanning the electron beam) over the area of the substrate inspected and collecting secondary and/or backscattered electrons with an electron detector. The image data is then processed to, for example, identify defects.

So, in an embodiment, the inspection apparatus may be an electron beam inspection apparatus (e.g., the same as or similar to a scanning electron microscope (SEM)) that yields an image of a structure (e.g., some or all the structure of a device, such as an integrated circuit) exposed or transferred on the substrate.

Figure 2:
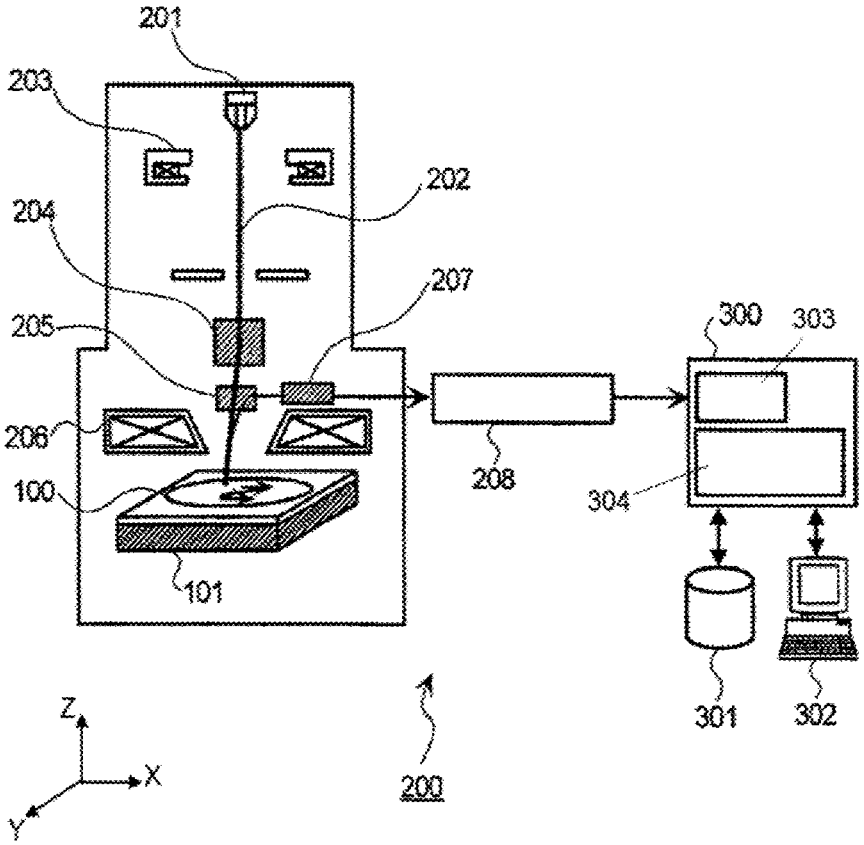
FIG. 2 is an illustrative diagram of an exemplary scanning electron microscope ("SEM"), in accordance with various embodiments.

FIG. 2 is an illustrative diagram of an exemplary scanning electron microscope ("SEM"), in accordance with various embodiments. FIG. 2 schematically depicts an embodiment of an electron beam inspection apparatus 200. In some embodiments, a primary electron beam 202 emitted from an electron source 201 is converged by condenser lens 203 and then may pass through a beam deflector 204, an E×B deflector 205, and an objective lens 206 to irradiate a substrate 100 on a substrate table 101 at a focus.

When the substrate 100 is irradiated with electron beam 202, secondary electrons are generated from the substrate 100. The secondary electrons are deflected by the E×B deflector 205 and detected by a secondary electron detector 207. A two-dimensional electron beam image can be obtained by detecting the electrons generated from the sample in synchronization with, e.g., two dimensional scanning of the electron beam by beam deflector 204 or with repetitive scanning of electron beam 202 by beam deflector 204 in an X or Y direction, together with continuous movement of the substrate 100 by the substrate table 101 in the other of the X or Y direction. Thus, in an embodiment, the electron beam inspection apparatus has a field of view for the electron beam defined by the angular range into which the electron beam can be provided by the electron beam inspection apparatus (e.g., the angular range through which the deflector 204 can provide the electron beam 202). Thus, the spatial extent of the field of the view is the spatial extent to which the angular range of the electron beam can impinge on a surface (wherein the surface can be stationary or can move with respect to the field).

A signal detected by secondary electron detector 207 is converted to a digital signal by an analog/digital (A/D) converter 208, and the digital signal is sent to an image processing system 300. In an embodiment, the image processing system 300 may have memory 303 to store all or part of digital images for processing by a processing unit 304. The processing unit 304 (e.g., specially designed hardware or a combination of hardware and software or a computer readable medium comprising software) is configured to convert or process the digital images into datasets representative of the digital images. In an embodiment, the processing unit 304 is configured or programmed to cause execution of a method described herein. Further, image processing system 300 may have a storage medium 301 configured to store the digital images and corresponding datasets in a reference database. A display device 302 may be connected with the image processing system 300, so that an operator can conduct necessary operation of the equipment with the help of a graphical user interface.

Processing unit 304 may correspond to one or more processors, which may include any suitable processing circuitry capable of controlling operations and functionality of one or more components/modules of system 300, as well as facilitating communications between various components within system 300 and/or with one or more other systems/components. In some embodiments, processing unit 304 may include a central processing unit ("CPU"), a graphic processing unit ("GPU"), one or more microprocessors, a digital signal processor, or any other type of processor, or any combination thereof. In some embodiments, the functionality of processing unit 304 may be performed by one or more hardware logic components including, but not limited to, field-programmable gate arrays ("FPGA"), application specific integrated circuits ("ASICs"), application-specific standard products ("ASSPs"), system-on-chip systems ("SOCs"), and/or complex programmable logic devices ("CPLDs"). Furthermore, processing unit 304 may include local memory, which may store program systems, program data, and/or one or more operating systems. However, processing unit 304 may run an operating system ("OS") for one or more components of system 300, and/or one or more firmware applications, media applications, and/or applications resident thereon. In some embodiments, processing unit 304 may run a local client script for reading and rendering content received from one or more websites. For example, processing unit 304 may run a local JavaScript client for rendering HTML or XHTML content received from a particular URL.

Memory 303 may include one or more types of storage mediums such as any volatile or non-volatile memory, or any removable or non-removable memory implemented in any suitable manner to store data for system 300. For example, information may be stored using computer-readable instructions, data structures, and/or program systems. Various types of storage/memory may include, but are not limited to, hard drives, solid state drives, flash memory, permanent memory (e.g., ROM), electronically erasable programmable read-only memory ("EEPROM"), CD-ROM, digital versatile disk ("DVD") or other optical storage medium, magnetic cassettes, magnetic tape, magnetic disk storage or other magnetic storage devices, RAID storage systems, or any other storage type, or any combination thereof. Furthermore, memory 303 may be implemented as computer-readable storage media ("CRSM"), which may be any available physical media accessible by processing unit 304 to execute one or more instructions stored within memory 303. In some embodiments, one or more applications may be run by processing unit 304, and may be stored in memory 303.

Figure 3:
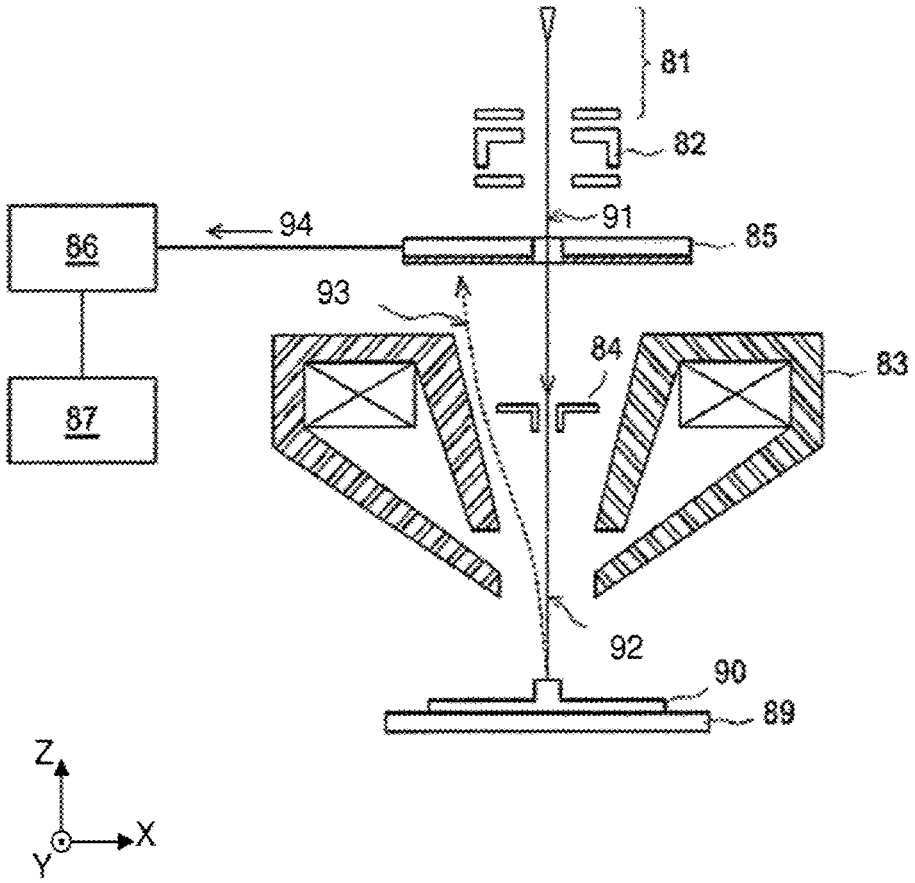
FIG. 3 is an illustrative diagram of an exemplary electron beam inspection apparatus, in accordance with various embodiments.

FIG. 3 is an illustrative diagram of an exemplary electron beam inspection apparatus, in accordance with various embodiments. The system, in some embodiments, may be used to inspect a sample 90 (such as a substrate) on a sample stage 89 and may include, amongst other aspects, a charged particle beam generator 81, a condenser lens module 82, a probe forming objective lens module 83, a charged particle beam deflection module 84, a secondary charged particle detector module 85, and an image forming module 86.

Charged particle beam generator 81 may be configured to generate a primary charged particle beam 91. Condenser lens module 82 may condense the generated primary charged particle beam 91. Probe forming objective lens module 83 may focus the condensed primary charged particle beam into a charged particle beam probe 92. Charged particle beam deflection module 84 scans the formed charged particle beam probe 92 across the surface of an area of interest on sample 90 secured on sample stage 89. In an embodiment, charged particle beam generator 81, condenser lens module 82 and probe forming objective lens module 83, or their equivalent designs, alternatives or any combination thereof, together may form a charged particle beam probe generator, which generates scanning charged particle beam probe 92.

Secondary charged particle detector module 85 may be configured to detect secondary charged particles 93 emitted from the sample surface (maybe also along with other reflected or scattered charged particles from the sample surface) upon being bombarded by charged particle beam probe 92 to generate a secondary charged particle detection signal 94. Image forming module 86 (e.g., a computing device) may be coupled with secondary charged particle detector module 85 to receive secondary charged particle detection signal 94 from secondary charged particle detector module 85 and accordingly forming at least one scanned image. In an embodiment, secondary charged particle detector module 85 and image forming module 86, or their equivalent designs, alternatives or any combination thereof, together may form an image forming apparatus which forms a scanned image from detected secondary charged particles emitted from sample 90 being bombarded by charged particle beam probe 92.

In an embodiment, a monitoring module 87 may be coupled to image forming module 86 of the image forming apparatus to monitor, control, etc., the patterning process and/or derive a parameter for patterning process design, control, monitoring, etc., using the scanned image of sample 90 received from image forming module 86. Therefore, in an embodiment, monitoring module 87 may be configured or programmed to cause execution of a method described herein. In an embodiment, monitoring module 87 may correspond to a computing device. In an embodiment, monitoring module 87 may correspond to a computer program to provide functionality herein and encoded on a computer readable medium forming, or disposed within, monitoring module 87.

In an embodiment, like the electron beam inspection tool of FIG. 2 that uses a probe to inspect a substrate, the electron current in the system of FIG. 3 is significantly larger compared to, e.g., a CD SEM such as depicted in FIG. 2, such that the probe spot is large enough so that the inspection speed can be fast. However, the resolution may not be as high as compared to a CD SEM because of the large probe spot.

The SEM images, from, e.g., the system of FIG. 2 and/or FIG. 3, may be processed to extract contours that describe the edges of objects, representing device structures, also referred to as features, in the image. These contours are then typically quantified via parameters, such as CD, at user-defined cut-lines. Thus, typically, the images of device structures are compared and quantified via metrics, such as an edge-to-edge distance (CD) measured on extracted contours or simple pixel differences between images. As would be understood by the skilled artisan, contour extraction may be performed, for example, using a tool such as Hitachi CD-SEM, available from Hitachi High Technologies America, Inc. of Schaumberg, Ill.

Now, besides measuring substrates in a patterning process, it is often desirable to use one or more tools to produce results that, for example, can be used to design, control, monitor, etc., the patterning process. To do this, there may be provided one or more tools used in computationally controlling, designing, etc., one or more aspects of the patterning process, such as the pattern design for a patterning device (including, for example, adding sub-resolution assist features or optical proximity corrections), the illumination for the patterning device, etc. Accordingly, in a system for computationally controlling, designing, etc., a manufacturing process involving patterning, the major manufacturing system components and/or processes can be described by various functional modules. In particular, in an embodiment, one or more mathematical models can be provided that describe one or more steps and/or apparatuses of the patterning process, including typically the pattern transfer step. In an embodiment, a simulation of the patterning process can be performed using one or more mathematical models to simulate how the patterning process forms a patterned substrate using a measured or design pattern provided by a patterning device.

Figure 4:
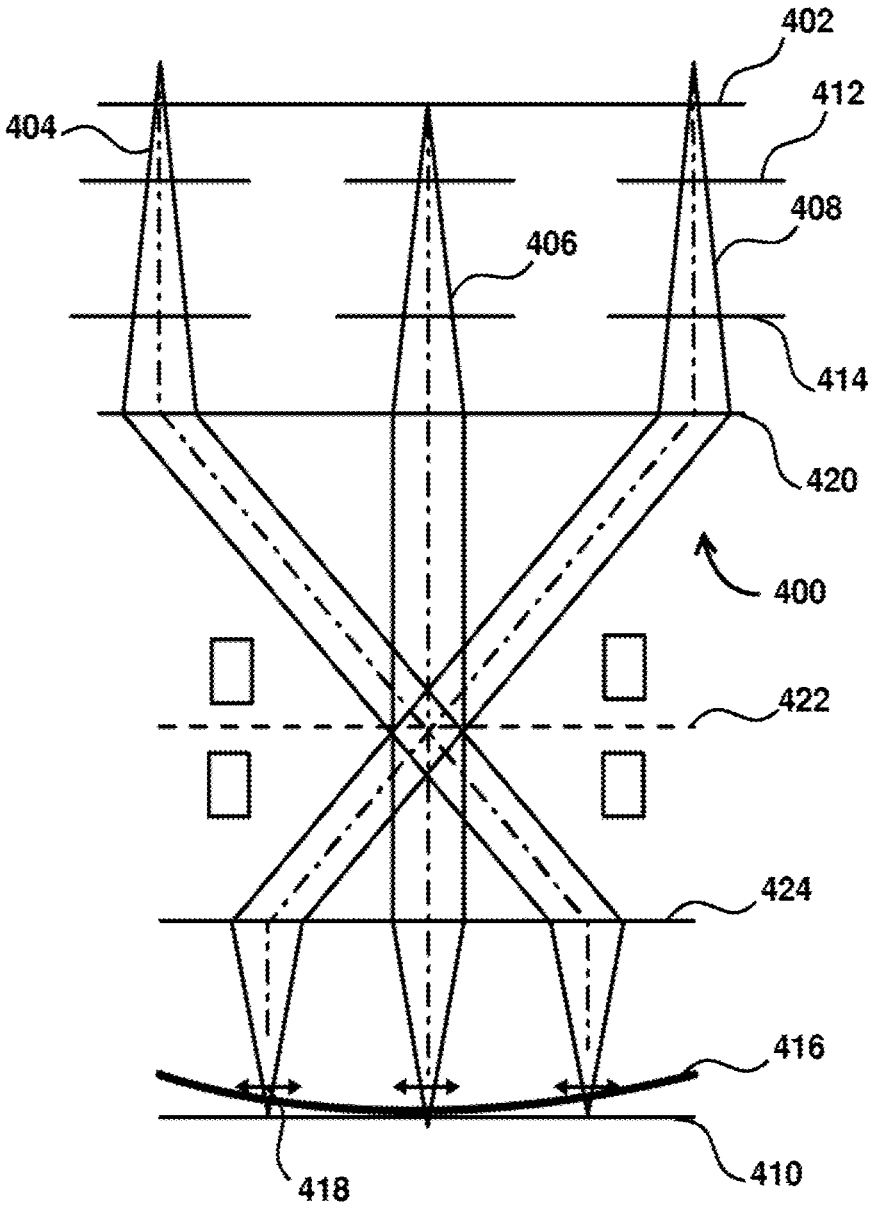
FIG. 4 schematically illustrates a multi-beam inspection tool in accordance with an embodiment.

FIG. 4 schematically illustrates a multi-beam inspection tool 400. The inspection tool includes a source or sources 402, that are operable to produce one or more beams of electrons, sometimes also referred to as beamlets. In practice, a single source may be used and an array of beamlets is formed from the single source. Broadly, "source" may indicate the initial source, or the source of each individual beamlet.

The beamlets 404, 406, 408 are each individually able to be transmitted from the sources 402 to a substrate 410 to be inspected. Each individual beamlet can be considered to operate as an individual SEM very much like the SEM illustrated in FIG. 3, and described above.

Multiple charged particle beams simultaneously form multiple beam spots on small scanned areas of a section of the surface of a sample at one time. This type of parallel scanning not only improves the efficiency of scanning, but also fundamentally reduces the charged particle interactions (Coulomb Effect) because the current of each beam of the plurality of charged particle beams is smaller when compared to a larger current needed for a single charged particle beam. These types of improvements can reduce the resolution deterioration of inspection due to the strong Coulomb Effect in a beam with a large current.

The beamlets pass through respective correction arrays 412, 414, that are configured to correct field aberrations such as curvature of field 416, or distortion 418. Additionally, the beamlets pass through a condenser lens 420, are scanned by way of scan deflector 422, and are finally projected onto the substrate via objective lens 424.

Figure 5:
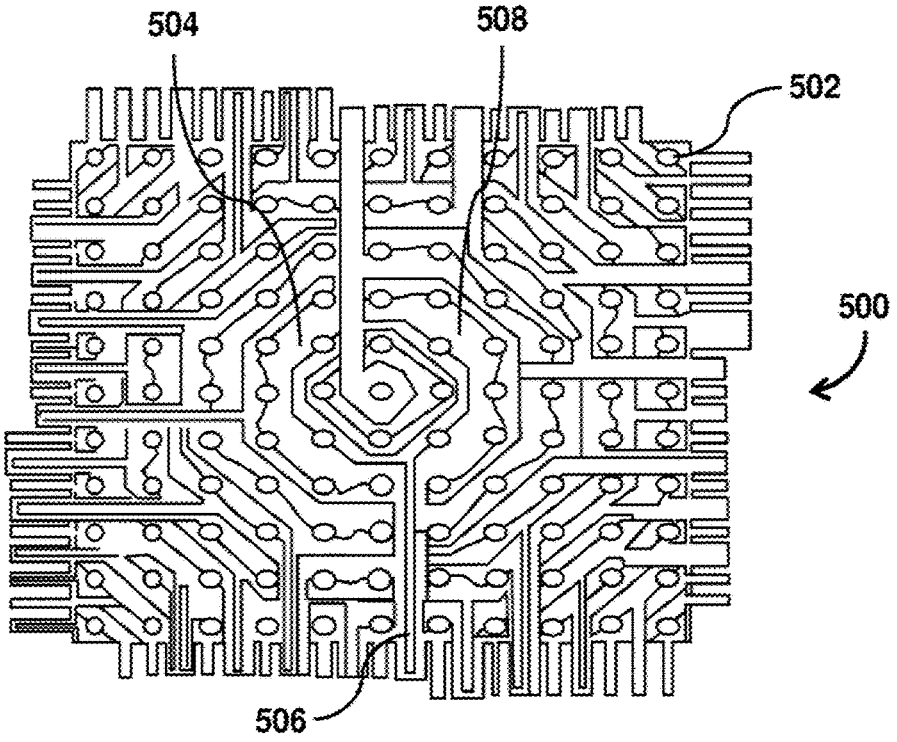
FIG. 5 schematically illustrates a micro deflector array in accordance with an embodiment.
Figure 6:
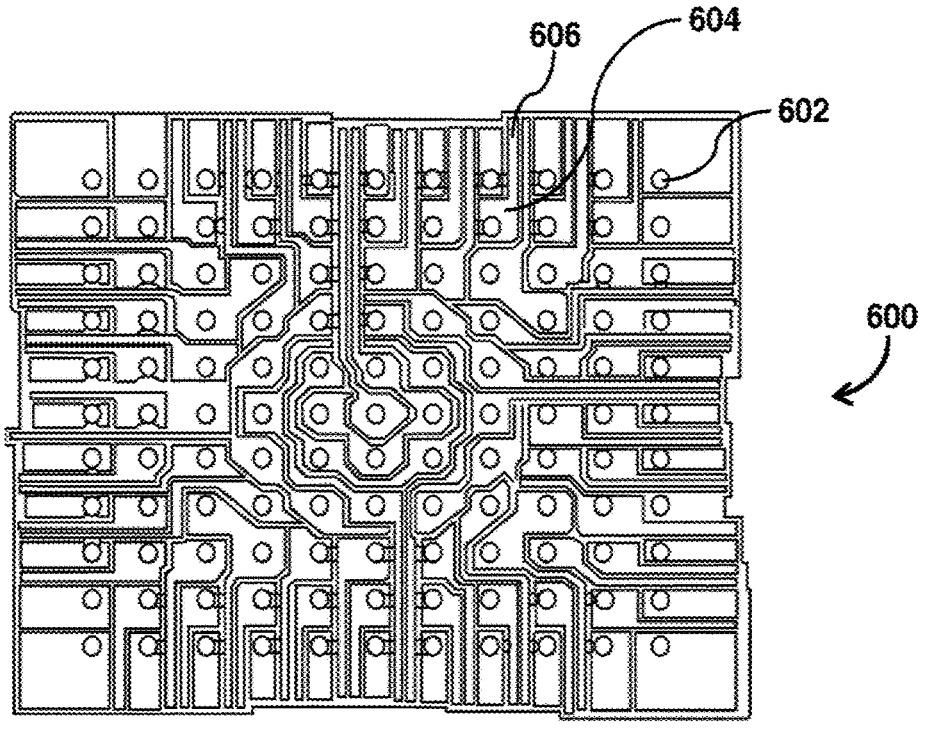
FIG. 6 schematically illustrates a micro lens array in accordance with an embodiment.

The correction arrays may be a micro deflector array 500 as shown in FIG. 5, in conjunction with a micro lens array 600 as shown in FIG. 6.

The micro deflector array 500 includes an array of apertures 602 through which the beamlets pass. It further includes electrodes 504 which are in communication with a voltage source (not shown) via leads 506. The electrodes can be charged to create varying electrical fields which provide the field aberration correction function as the beamlets pass through the apertures. Each aperture has two or more sections that can be set to different electrical potential in order to effect a desired deflection of the beam passing therethrough. In a simplest example, the left side may be set to have a positive potential while the right side has a negative potential. In this case, the beam of (negatively charged) electrons will be deflected to the left side.

In the embodiment of FIG. 5, the electrodes are configured to have partial radial symmetry, note, for example, that electrode 504 and 508 together form a ring around the center of the array 500. As understood by the skilled artisan, aberrations in beam optical systems are well-described by the radially symmetric Zernike polynomials, and corrections can be calculated on this basis. As may be observed, strict radial symmetry is not required, and the electrodes as illustrated are not precise rings, but rather are generally radially symmetric about the center of the array. Thus, this array 500 provides a radial displacement of the beamlets in order to correct for aberrations.

The micro lens array 600 of FIG. 6 similarly includes an array of apertures 602 through which the beamlets pass. Likewise, the array includes many electrodes 604 in communication with a voltage source (not shown) via leads 606. As with the deflector array, embodiments may include a degree of radial symmetry.

While both the lens array 600 and the deflector array 500 have in common that they consist of an array of holes through which the beamlets pass, in the lens array the electrical potential should be uniform at the edges of the aperture, unlike the independently controllable potentials described above with respect to the deflector array 500.

In operation, the micro deflector array 500 may be used to provide beam position adjustments, offsetting the beam position radially to correct distortion. The micro lens array 600 is used to offset beam position in the focus direction in order to correct field curvature.

Figure 7:
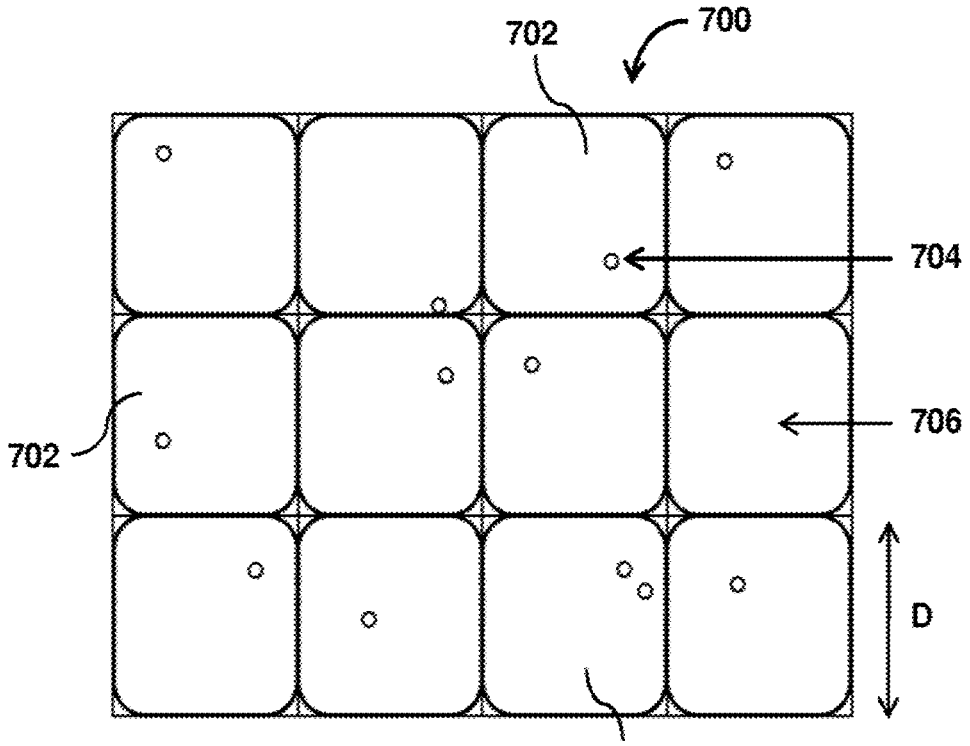
FIG. 7 schematically illustrates an array of inspection fields.

FIG. 7 schematically illustrates an array 700 of inspection fields 702. As illustrated, the fields are arrayed in accordance with a pitch, D. In an example, the pitch may be on the order of 18 μm. Within the array 700 there are a number of hotspots 704, or inspection targets that are of particular importance. For example, the hotspots may represent portions of the pattern that are particularly sensitive to imaging parameters, such as particularly fine features, particularly dense features, or features that are critical to operation of the final product. Typically, such hotspots can be identified by performing lithographic simulation and determining which portions of the image are key to accurate reproduction of the mask image. In an embodiment, they may be locations that have been determined to be particularly representative of the image quality as a whole. In an embodiment, the hotspots may be identified by actual imaging operations and inspection rather than by simulation. However they are selected, they represent portions of the substrate that are important to the inspection of the product. A measure of criticality can be used as a determining factor as to which targets are hotspots. An inspection plan for a particular substrate layout therefore may consist of a plurality of selected target locations.

In the illustrated example, these hotspots are randomly located within the inspection fields 702.

Some fields, such as field 706 contain no hotspots, while others such as field 708 may contain multiple hotspots. In an embodiment, a high resolution SEM image of each hotspot may require imaging of a 500 nm×500 nm region (0.25 $\mu m^2$). Thus, a single beam inspection device would require imaging approximately 3 $\mu m^2$ (i.e., 12×0.5×0.5 μm) to cover all 12 hotspots.

Figure 8:
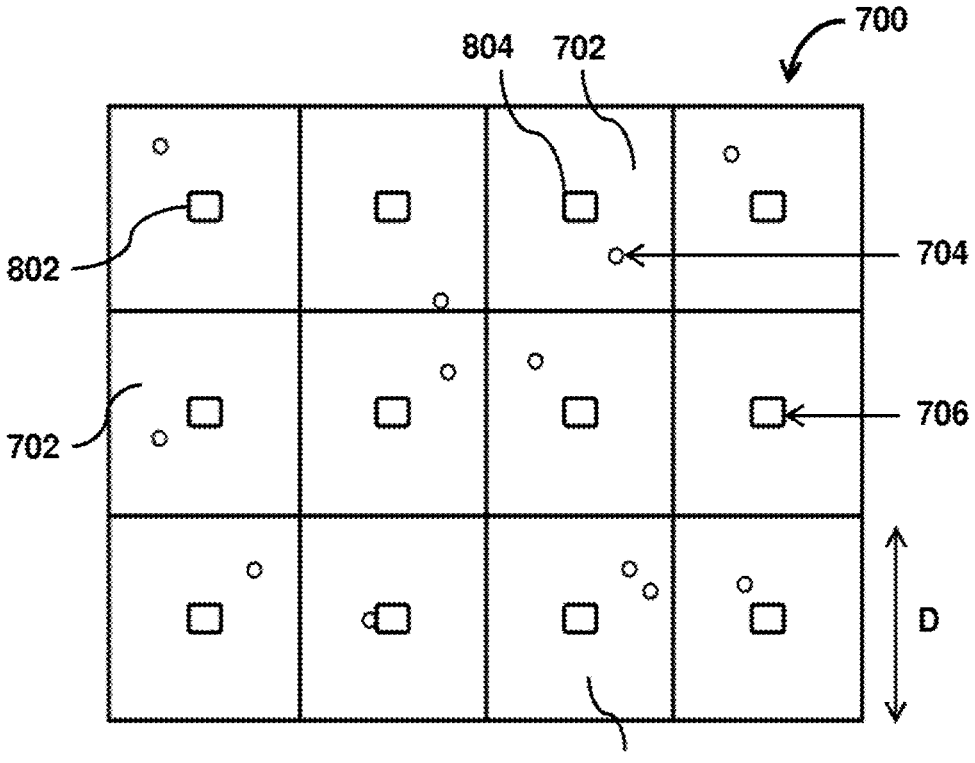
FIG. 8 schematically illustrates an array of inspection fields having beamlet spots from a multi-beam inspection tool in accordance with an embodiment.

FIG. 8 illustrates the same array 700 from FIG. 7. Superimposed on the array 700 are several beamlet spots 802. These beamlet spots 802 represent a portion of the beamlets produced by the inspection tool 400 after passing through the deflector array 500 and the micro lens array 600, and after being projected via the objective lens 424. One particular beamlet spot 804 is located in the field where hotspot 704 is located for the purpose of illustration.

As can be seen, the beamlets as shown are similarly separated by a distance approximately equal to the pitch, D, such that each beamlet strikes a center of each inspection field.

The skilled artisan will appreciate that to ensure scanning of each of the randomly located hotspots 704, the array of beamlets will have to be scanned across approximately the entire field. Thus, a full scan will require a time equal to the pitch divided by the scan rate for each raster line, and the total number of lines will be equal to the pitch divided by the spot size of the beamlet spots 802. That is, the time will be related to the area of the field and inversely related to the width of the spot in the direction perpendicular to the scan and to the scan rate. A large proportion of that scan time will be spent scanning over portions of the field that are not critical (hotspots) and in the case of field 706, the entirety of the scan will be spent without ever encountering a hotspot, meaning that beam is entirely wasted. Thus, the theoretical improvement provided by a multibeam tool ends up being diminished.

By way of example, if this type of multibeam device having 12 beams is used, where the 12 beams are at constant pitch, 12 randomly distributed hotspots may require imaging of 3888 $\mu m^2$ (i.e., 12×18 $\mu m^2$×18 $\mu m^2$), because the entire field may have to be imaged. Thus, paradoxically, the twelve beam system involves imaging a much larger area than the single beam system, and provides no real improvement in throughput. Theoretically, the total imaging time could be controlled to be approximately equal to the single beam imaging time, and 12 times the area would be imaged at high resolution, including a lot of area empty of hotspots.

Figure 9:
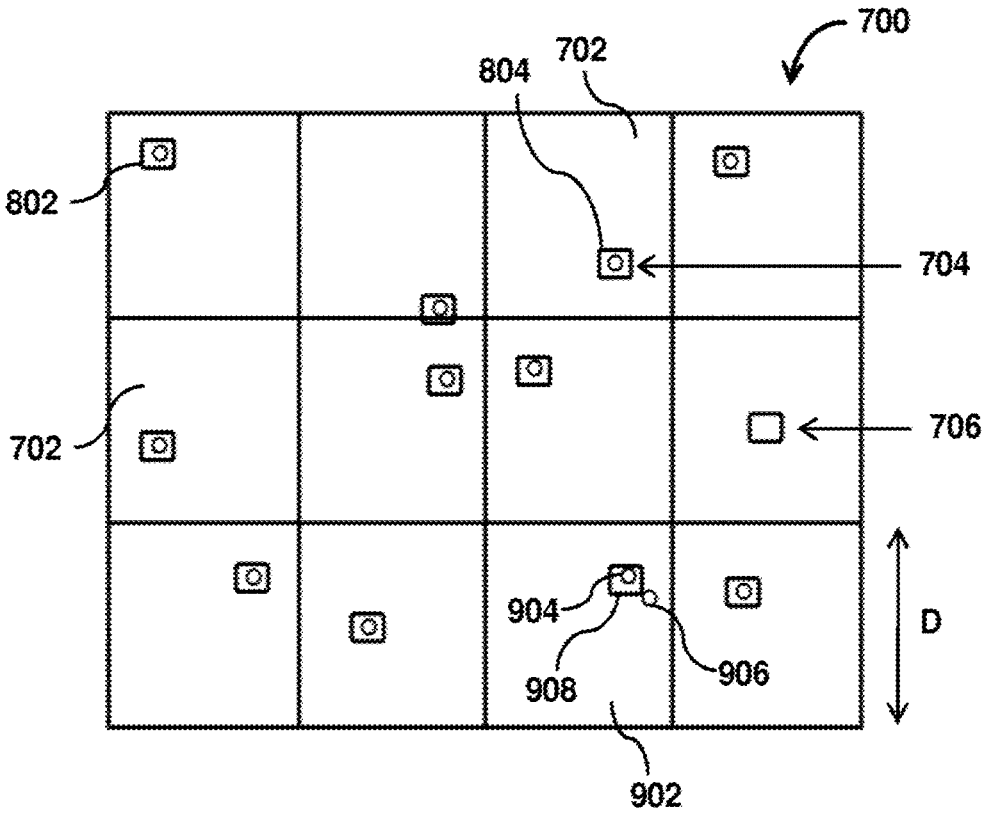
FIG. 9 schematically illustrates an array of inspection fields having addressable beamlet spots from a multi-beam inspection tool in accordance with an embodiment.

FIG. 9 represents an embodiment in which the beamlets are able to be individually targeted (individually addressable) onto beamlet spots 802'. That is, at least one of the beamlets is targeted to a location that is offset from the standard grid, resulting in a change of pitch for that beamlet with respect to its nearest neighbors. This change of pitch of the at least one of the beamlets generates, in operation, an irregular grid of spots on the surface of the substrate 410. In practice, one, some, or all of the beamlets may be individually targeted. In a given instant, depending on the specific targeting, the pitch of any particular beamlet pair may still be D, even as one or both members of the pair are targeted.

As in FIG. 8, a particular beamlet spot 804' is shown as targeting hotspot 704. As will be appreciated, because each of the beamlets can be focused onto a respective hotspot, each will only have to scan the 500 nm×500 nm region for that hotspot. The field 706 still has no hotspot, so its respective beamlet spot will be idle in this embodiment. Field 902 contains two hotspots, 904 and 906. This means that the beamlet spot 908 will need to scan twice in order to cover all hotspots within its field.

As will be appreciated, this means that the total scan time will be defined by the number of hotspots in the field having the most hotspots. This may mean that the other beamlets are idle during the second or subsequent scans. Nevertheless, compared to the single beam, the total scan time in the illustrated case would be approximately 1/6. Compared to the constant pitch scan, the total scan time would be significantly faster, no greater than 1/6, and possibly an even greater savings.

In an embodiment, while the second scan is being performed on field 902, the other beams may be used to perform a second scan of their respective hotspots. This could allow for averaging of measurements or other noise reduction or image enhancement techniques.

Figure 10:
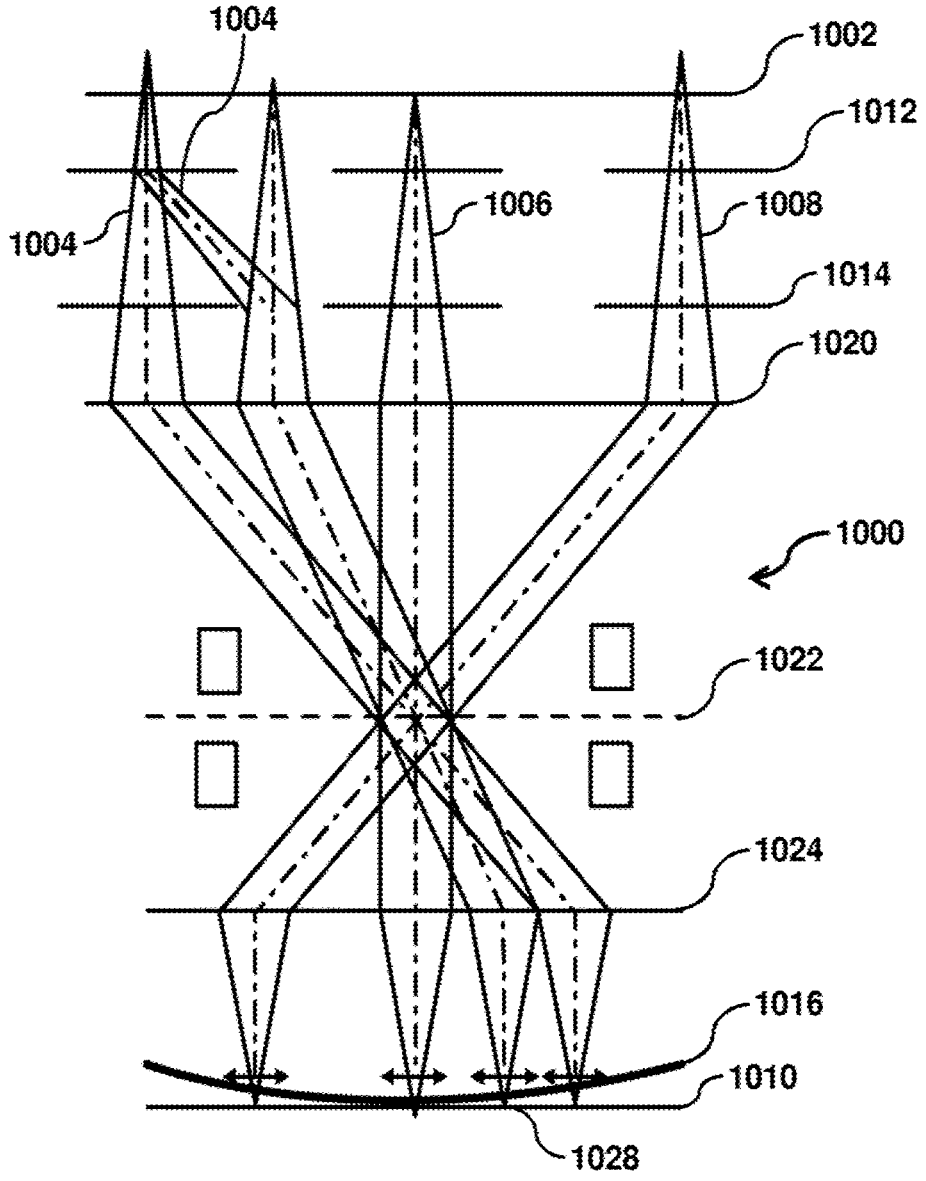
FIG. 10 schematically illustrates an inspection tool having individually addressable beamlets in accordance with an embodiment.

FIG. 10 schematically illustrates a multi-beam inspection tool 1000 having independently targetable beamlets. The inspection tool includes a source or sources 1002, that are operable to produce one or more beams of electrons, sometimes also referred to as beamlets. The beamlets 1004, 1006, 1008 are each individually able to be transmitted from the sources 1002 to a substrate 1010 to be inspected. Each individual beamlet can be considered to operate as an individual SEM very much like the SEM illustrated in FIG. 3, and described above.

The beamlets pass through respective correction arrays 1012, 1014, that are configured to correct field aberrations such as curvature of field 1016, or distortion 1018. Additionally, the beamlets pass through a condenser lens 1020, are scanned by way of scan deflector 1022, and are finally projected onto the substrate via objective lens 1024.

The correction array 1012 may also include additional functionality allowing the independent targeting of the beamlets. That is, in addition to the field correction function, the electrodes may be configured to provide targeting of the beamlets. Alternately, a third micro array could be provided (not shown). That is, in order to provide the full addressability, either two deflector arrays plus one lens array may be provided, or the lens functionality may be superimposed on one of the deflector arrays such that a single deflector array plus one deflector/lens array could be used. By way of example, for a particular aperture that requires a −3 kV potential for the lens function, and a left right differential of 200V (+100V left, −100V right), the array would be set at −2.9 kV left and −3.1 kV right, thereby providing both functions with a single electrode set.

This is illustrated by beamlet 1004'. This represents a steering of original beamlet 1004 as it passes through the first correction array 1012. As will be appreciated, the steering function may be performed instead at the level of the second correction array 1014, or as described above, in a third, separate array not shown.

The beamlet 1004' is therefore shifted at the substrate level from a first target location 1026 to a second target location 1028. As will be appreciated, this may represent a shift from the location 804 as shown in FIG. 8 to the location 804' as shown in FIG. 9. The introduction of the additional independent steering or targeting functionality then allows for the beamlets to be targeted to specific hotspots within their respective fields of view. That is, the fixed pitch scan of FIG. 8 is transformed into the individually targeted scan of FIG. 9 by way of this added functionality.

Figure 11:
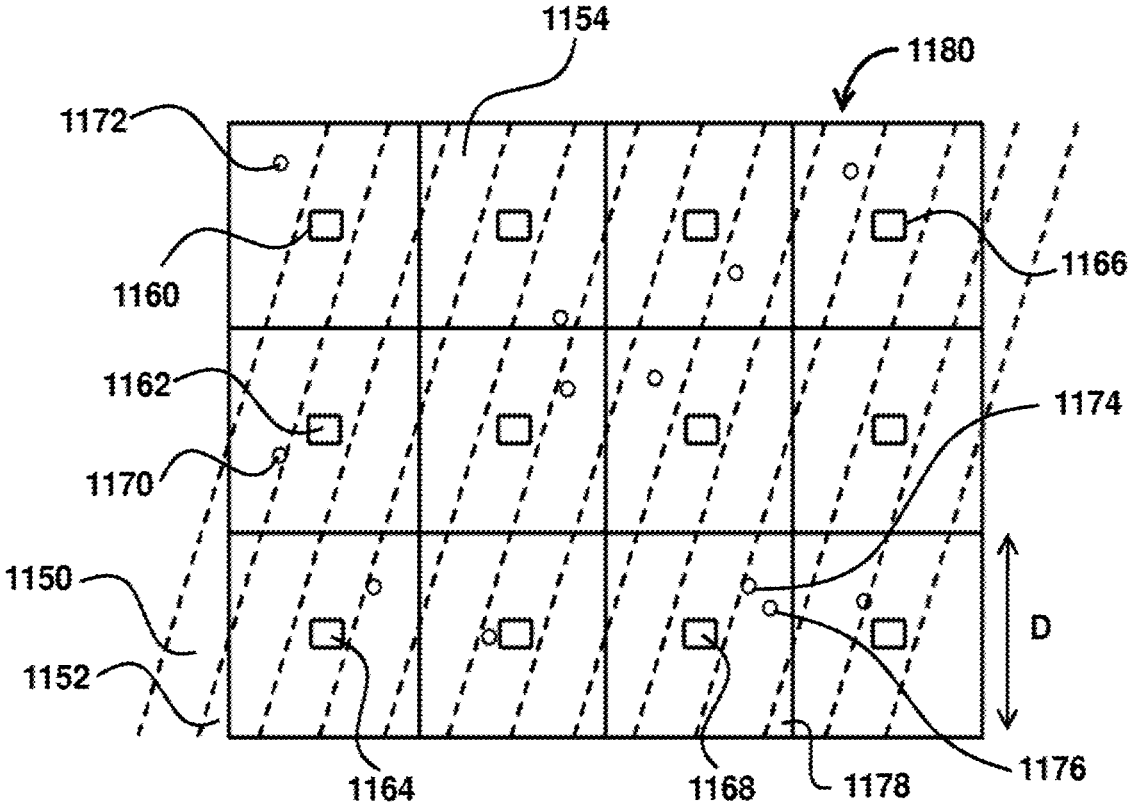
FIG. 11 schematically illustrates an array of inspection fields in accordance with an embodiment in which the inspected substrate is scanned relative to the inspection device.

In an embodiment, the substrate may be inspected using a continuous stage scan. The scan pattern produced using this approach is illustrated in FIG. 11. The substrate is moved relative to the field of view of the inspection tool. In an embodiment, this motion is diagonal relative to the grid of fields for the inspection beamlets. As the substrate is scanned, each beamlet is able to scan any hotspot that passes through its respective portion of the field. As will be appreciated, the stage speed should be controlled to ensure that the inspection beamlets have sufficient time to image the hotspots. In a non-limiting example, scan speeds may be on the order of 500 μm/s, allowing for a full 500×500 nm region to be scanned in 1 ms.

The dotted lines define inspection fields 1150, 1152, 1154, 1156, etc. For each inspection field, one of the beamlets will have the responsibility of inspecting hotspots within that field during the scan. Thus, field 1150 is inspected by beamlet spot 1160, field 1152 is inspected by beamlet spot 1162, and so on.

As will be appreciated, this means that the hotspot 1170 in field 1150 will be inspected by beamlet spot 1160 as it passes into that spot's field of view. This also means that while hotspot 1172 is nominally within the 18×18 μm field that beamlet 1160 may reach, it is outside of the scanning field for which that beamlet is responsible. This means either that an adjacent beamlet not shown will scan hotspot 1172, or that hotspot 1172 will be scanned in a previous or a subsequent scan.

Because there are no hotspots within the inspection field 1152, nor in 1154, the beamlets responsible for these regions will not inspect any hotspots. In contrast, inspection field 1156 includes two hotspots 1174 and 1176, such that beamlet 1166 will be responsible for imaging both of these hotspots.

One solution to this is to allow beamlets to take responsibility for areas outside of their respective lanes, but inside their 18×18 μm field. That is, while the primary responsibility may be for the individual lane, otherwise idle beamlets may be allowed to take broader responsibility. In this approach, beamlet 1168 may inspect hotspot 1174 when the hotspots transit field 1178 and beamlet 1166 may inspect hotspot 1176 as when the hotspots transit field 1180.

Similarly, otherwise idle beamlets can be used to re-scan hotspots that already been (or will soon be) scanned, to allow for averaging of measurement results. This may be seen, for example, in hotspot 1170, which may be imaged by otherwise idle beamlet 1162 and then as it proceeds north, reimaged by beamlet 1160.

Because multiple images of a single feature may be acquired, it may be necessary to identify hotspots uniquely so that the measurements can be properly associated with the same hotspot. The locations can therefore be assigned a coordinate relative to the substrate. Thus, each scanned hotspot is associated with a unique position on the substrate and measurements may be associated properly with each other when multiple scans of a single spot are performed.

Allowing for the ability to individually address each beamlet as described above creates issues in allowing space for the leads 506 in the deflector. In the deflector 500 of FIG. 5, many of the apertures are held at common potential because they are used to correct for radial aberrations. Thus, there is not a need for every aperture to have a complete set of leads, as several will share a common lead as they share a common electrode.

Figure 13:
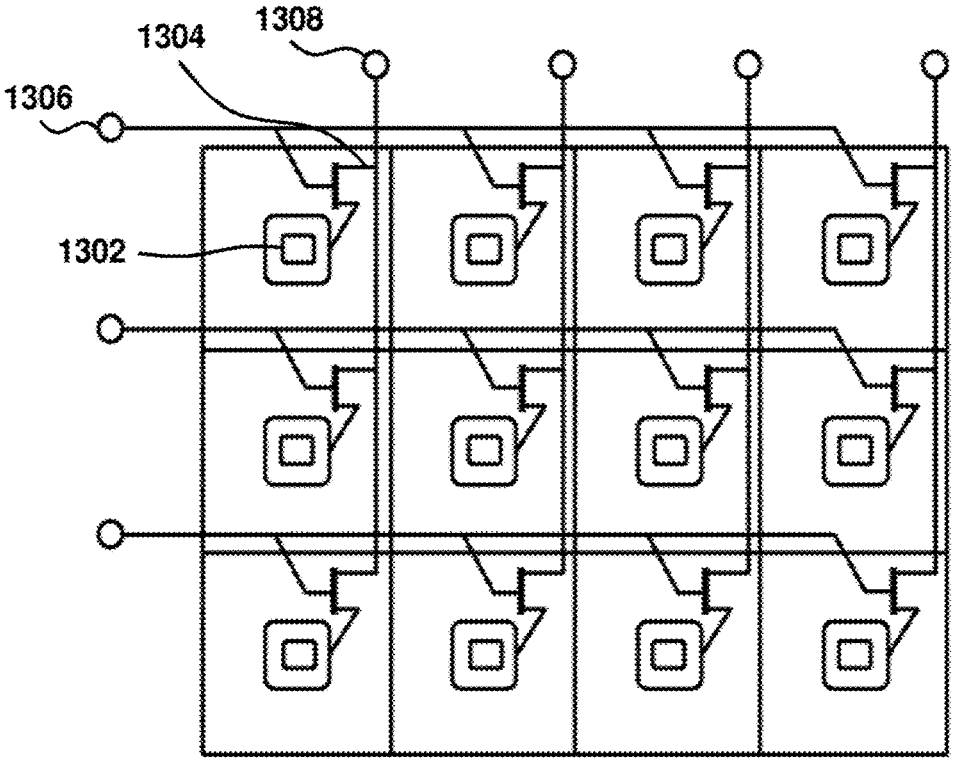
FIG. 13. schematically illustrates an arrangement for allowing individual addressability of scanning apertures by way of a bit and word line arrangement.

The deflector 1012, on the other hand, incorporates the ability for each electrode to be individually controllable. Thus the number of leads multiplies and the layout becomes more complex. FIG. 13 illustrates an approach to allowing individual addressability by way of a bit and word line arrangement.

Each electrode 1302, etc. is connected to a respective drain of a transistor 1304 acting as a switch. In principle, a different type of electrically operable switch could be used, but transistors are compact and easy to produce and are therefore particularly well-suited to this application. The horizontal lines 1306 act as bit lines, while the vertical lines 1308 act as word lines. Thus, when bit lines 1306 are activated (the transistor is opened) by application of an energizing voltage, the information from the word lines 1308 is allowed to flow to (charge) the electrode. The rows are therefore addressed serially, row by row. In a typical deflector, the array may be on the order of 16×16, so that each row is addressed at 1/16 the refresh rate of the system. The electrodes will be charged to potentials on the order of hundreds of volts in this SEM context, while the opening voltage of the bit lines may be on the order of 1V (theoretically, 0.7V). In an embodiment, the energizing voltage may be on the order of hundreds of volts, more particularly between about 100V and about 400V.

Figure 12:
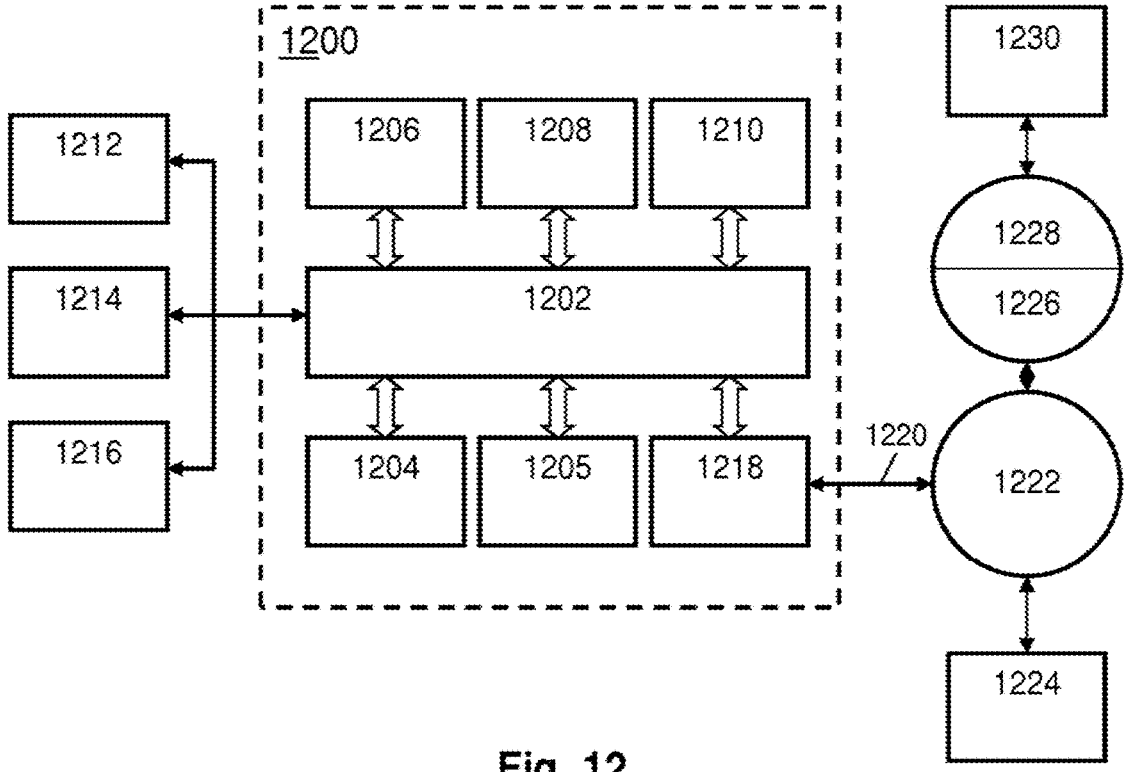
FIG. 12 schematically illustrates a computer system that may implement embodiments of this disclosure.

FIG. 12 schematically depicts a computer system that may implement embodiments of this disclosure. Referring to FIG. 14, a computer system 1200 is shown. The computer system 1200 includes a bus 1202 or other communication mechanism for communicating information, and a processor 1204 (or multiple processors 1204) coupled with bus 1202 for processing information. Computer system 1200 also includes a main memory 1206, such as a random access memory (RAM) or other dynamic storage device, coupled to bus 1202 for storing information and instructions to be executed by processor 1204. Main memory 1206 also may be used for storing temporary variables or other intermediate information during execution of instructions to be executed by processor 1204. Computer system 1200 further includes a read only memory (ROM) 1208 or other static storage device coupled to bus 1202 for storing static information and instructions for processor 1204. A storage device 1210, such as a magnetic disk or optical disk, is provided and coupled to bus 1202 for storing information and instructions.

Computer system 1200 may be coupled via bus 1202 to a display 1212, such as a cathode ray tube (CRT) or flat panel or touch panel display for displaying information to a computer user. An input device 1214, including alphanumeric and other keys, is coupled to bus 1202 for communicating information and command selections to processor 1204. Another type of user input device is cursor control 1216, such as a mouse, a trackball, or cursor direction keys for communicating direction information and command selections to processor 1204 and for controlling cursor movement on display 1212. This input device typically has two degrees of freedom in two axes, a first axis (e.g., x) and a second axis (e.g., y), that allows the device to specify positions in a plane. A touch panel (screen) display may also be used as an input device.

The computer system 1200 may be suitable to function as a processing unit herein in response to processor 1204 executing one or more sequences of one or more instructions contained in main memory 1206. Such instructions may be read into main memory 1206 from another computer-readable medium, such as storage device 1210. Execution of the sequences of instructions contained in main memory 1206 causes processor 1204 to perform a process described herein. One or more processors in a multi-processing arrangement may also be employed to execute the sequences of instructions contained in main memory 1206. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 1204 for execution. Such a medium may take many forms, including but not limited to, non-volatile media, volatile media, and transmission media. Non-volatile media include, for example, optical or magnetic disks, such as storage device 1210. Volatile media include dynamic memory, such as main memory 1206. Transmission media include coaxial cables, copper wire and fiber optics, including the wires that comprise bus 1202. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1204 for execution. For example, the instructions may initially be borne on a magnetic disk of a remote computer. The remote computer can load the instructions into its dynamic memory and send the instructions over a telephone line using a modem. A modem local to computer system 1200 can receive the data on the telephone line and use an infrared transmitter to convert the data to an infrared signal. An infrared detector coupled to bus 1202 can receive the data carried in the infrared signal and place the data on bus 1202. Bus 1202 carries the data to main memory 1206, from which processor 1204 retrieves and executes the instructions. The instructions received by main memory 1206 may optionally be stored on storage device 1210 either before or after execution by processor 1204.

Computer system 1200 may also include a communication interface 1218 coupled to bus 1202. Communication interface 1218 provides a two-way data communication coupling to a network link 1220 that is connected to a local network 1222. For example, communication interface 1218 may be an integrated services digital network (ISDN) card or a modem to provide a data communication connection to a corresponding type of telephone line. As another example, communication interface 1218 may be a local area network (LAN) card to provide a data communication connection to a compatible LAN. Wireless links may also be implemented. In any such implementation, communication interface 1218 sends and receives electrical, electromagnetic or optical signals that carry digital data streams representing various types of information.

Network link 1220 typically provides data communication through one or more networks to other data devices. For example, network link 1220 may provide a connection through local network 1222 to a host computer 1224 or to data equipment operated by an Internet Service Provider (ISP) 1226. ISP 1226 in turn provides data communication services through the worldwide packet data communication network, now commonly referred to as the "Internet" 1228. Local network 1222 and Internet 1228 both use electrical, electromagnetic or optical signals that carry digital data streams. The signals through the various networks and the signals on network link 1220 and through communication interface 1218, which carry the digital data to and from computer system 1200, are exemplary forms of carrier waves transporting the information.

Computer system 1200 can send messages and receive data, including program code, through the network(s), network link 1220, and communication interface 1218. In the Internet example, a server 1230 might transmit a requested code for an application program through Internet 1228, ISP 1226, local network 1222 and communication interface 1218. In accordance with one or more embodiments, one such downloaded application provides for a method as disclosed herein, for example. The received code may be executed by processor 1204 as it is received, and/or stored in storage device 1210, or other non-volatile storage for later execution. In this manner, computer system 1200 may obtain application code in the form of a carrier wave.

An embodiment may include a computer program containing one or more sequences of machine-readable instructions that enable practice of a method as described herein. This computer program may be included, for example, with or within the apparatus of any of FIG. 1-11 or 13. There may also be provided a data storage medium (e.g., semiconductor memory, magnetic or optical disk) having such a computer program stored therein. Where an existing apparatus, for example of the type shown in any FIG. 1-11 or 13 already in production and/or in use, an embodiment can be implemented by the provision of updated computer program products for causing a processor of the apparatus to perform a method as described herein.

The embodiments may further be described using the following clauses:

1. An apparatus for inspecting a substrate having a pattern thereon, comprising:
   a source of a plurality of electron beamlets;
   a condenser lens, configured to receive the beamlets and reduce a divergence thereof;
   a scan deflector; configured and arranged to displace the beamlets as a group to scan a surface of the substrate;
   an objective lens, configured and arranged to focus the beamlets onto the surface of the substrate; and
   an addressable deflector, configured and arranged to independently displace each beamlet to impinge on selected target locations such that at least one beamlet changes pitch with respect to its nearest neighbors.
2. An apparatus as in clause 1, wherein the addressable deflector is configured to generate an irregular grid on the surface of the substrate.
3. An apparatus as in clause 1 or 2, further comprising an aberration correcting deflector, configured and arranged to controllably displace the beamlets to correct aberration.
4. An apparatus as in any of the previous clauses, further comprising a micro lens array, configured and arranged to controllably displace the beamlets to correct a field curvature.
5. An apparatus as in any of the previous clauses, wherein the addressable deflector and the aberration correcting deflector are disposed in conjugate planes.
6. An apparatus as in any of the previous clauses, wherein the addressable deflector and the aberration correcting deflector are embodied in a single array of apertures and associated electrodes.
7. An apparatus as in clause 3 to 6, wherein the aberration correcting deflector is configured and arranged to controllably displace the beamlets in a radial direction to correct aberrations and wherein the micro lens array is configured and arranged to controllably displace the beamlets in a focus direction to correct the field curvature.
8. An apparatus as in clauses 1 to 7, further comprising a movable stage configured to hold the substrate during the inspecting.
9. An apparatus as in clause 8, wherein the movable stage is configured to move the substrate relative to the beamlets during the inspecting.
10. An apparatus as in clauses 1 to 9, wherein the addressable deflector has independently addressable electrodes comprising:
    an array of apertures configured to allow passage of an electron beam therethrough;
    an array of electrodes, each electrode of the array positioned proximate a respective aperture, the electrodes configured and arranged to, when energized, produce an electric field for steering the electron beam passing through the aperture;
    a first set of electrical leads extending in a first direction across the array of electrodes, the first set of electrical leads being in electrical communication with an array of switches, the switches being controllable by energizing leads of the first set of electrical leads; and
    a second set of electrical leads extending in a second direction across the array of electrodes different from the first direction, the second set of electrical leads being in electrical communication with the array of switches, such that when the switches are opened in response to energizing leads of the first set of electrical leads, charge from a respective one of the second set of electrical leads is allowed to flow to charge a selected electrode of the array of electrodes.
11. An apparatus as in clause 10, wherein the second set of electrical leads is configured to provide a potential to the selected electrode of between 100V and 400V.
12. A method of inspecting a substrate having a pattern imaged thereon, comprising:
    obtaining a plurality of selected target locations on the substrate; scanning the substrate with a plurality of electron beamlets, wherein the scanning comprises individually addressing the beamlets to impinge on the selected target locations independently such that at least one beamlet changes pitch with respect to its nearest neighbors;
    detecting reflected, transmitted, or secondary electrons of the beamlets and generating images of the selected target locations.
13. A method as in clause 12, wherein the individually addressing is configured to generate an irregular grid on the surface of the substrate
14. A method as in clause 12 or 13, wherein the selected target locations are selected on the basis of a measure of criticality.
15. A method as in clause 12 or 13, wherein the selected target locations are selected dependent on characteristics of the pattern.
16. A method as in clause 12 or 13, wherein the scanning comprises individually deflecting each beamlet independently using an array of individually addressable electrodes.
17. A method as in clause 12 or 13, wherein the array of individually addressable electrodes is addressable by sequentially energizing a first plurality of leads such that as each lead of the first plurality of leads is energized, a signal from a respective one of a second plurality of leads is allowed to flow to the electrode, the signal from each of the second plurality of leads having a voltage selected to steer a respective one of the beamlets to a selected one of the target locations.

18. A method as in clause 12 or 13, further comprising: moving the substrate relative to the beamlets during the scanning
19. A method as in clause 12 or 13, further comprising scanning one or more of the target locations with more than one beamlet.
20. A computing device including memory and at least one processor, the at least one processor being operable to control an inspection device in accordance with the method of any of clauses 12 to 19.
21. A machine readable medium encoded with machine executable instructions for controlling an inspection device in accordance with the method of any of clauses 12 to 19.

An embodiment of the invention may take the form of a computer program containing one or more sequences of machine-readable instructions to cause execution of a method as disclosed herein, or a data storage medium (e.g., semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

Although specific reference may have been made above to the use of embodiments in the context of optical lithography, it will be appreciated that an embodiment of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Although specific reference may be made in this text to the manufacture of ICs, it should be understood that the description herein has many other possible applications. For example, it may be employed in the manufacture of integrated optical systems, guidance and detection patterns for magnetic domain memories, flat-panel displays, micro-electro mechanical systems (MEMS), liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Unless specifically noted otherwise, the terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

It is noted that the terms "mask", "reticle", "patterning device" are utilized interchangeably herein. Also, a person skilled in the art will recognize that, especially in the context of lithography simulation/optimization, the term "mask"/"patterning device" and "design layout" can be used interchangeably, as in lithography simulation/optimization, that a physical patterning device is not necessarily used but a design layout can be used to represent a physical patterning device.

The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

In an optimization process of a system or process, a figure of merit of the system or process can be represented as a cost function. The optimization process boils down to a process of finding a set of parameters (design variables) of the system or process that optimizes (e.g., minimizes or maximizes) the cost function. The cost function can have any suitable form depending on the goal of the optimization. For example, the cost function can be weighted root mean square (RMS) of deviations of certain characteristics (evaluation points) of the system or process with respect to the intended values (e.g., ideal values) of these characteristics; the cost function can also be the maximum of these deviations (i.e., worst deviation). The term "evaluation points" herein should be interpreted broadly to include any characteristics of the system or process. The design variables of the system or process can be confined to finite ranges and/or be interdependent due to practicalities of implementations of the system or process. In the case of a lithographic apparatus or patterning process, the constraints are often associated with physical properties and characteristics of the hardware such as tunable ranges, and/or patterning device manufacturability design rules, and the evaluation points can include physical points on a resist image or pattern on a substrate, as well as non-physical characteristics such as dose and focus.

The term "optimizing" and "optimization" as used herein refers to or means adjusting a patterning process apparatus, one or more steps of a patterning process, etc., such that results and/or processes of patterning have more desirable characteristics, such as higher accuracy of transfer of a design layout on a substrate, a larger process window, etc. Thus, the term "optimizing" and "optimization" as used herein refers to or means a process that identifies one or more values for one or more parameters that provide an improvement, e.g., a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g., within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

The descriptions above are intended to be illustrative, not limiting. Thus, it will be apparent to one skilled in the art that modifications may be made to the invention as described without departing from the scope of the claims set out below. For example, one or more aspects of one or more embodiments may be combined with or substituted for one or more aspects of one or more other embodiments as appropriate.

Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance. The breadth and scope of the invention should not be limited by any of the above-described exemplary embodiments, but should be defined only in accordance with the following claims and their equivalents.

What is claimed is:

1. An apparatus for inspecting a substrate having a pattern thereon, the apparatus comprising: a condenser lens configured to receive a plurality of electron beamlets and reduce a divergence thereof; a scan deflector configured and arranged to displace the beamlets as a group to scan a surface of the substrate; an objective lens configured and arranged to focus the beamlets onto the surface of the substrate; and an addressable deflector configured and arranged to independently displace each beamlet to impinge on a selected target location; and instructions, when executed by at least one processor, programmed to control, or cause control of, the addressable deflector such that at least one beamlet has its pitch changed with respect to its nearest neighbors when emitted from the addressable deflector for generating an irregular grid *arrangement of the beamlets at impingement* on the surface of the substrate.

2. The apparatus as in claim 1, further comprising an aberration correcting deflector configured and arranged to controllably displace the beam lets to correct aberrations.

3. The apparatus as in claim 1, further comprising a micro lens array configured and arranged to controllably displace the beam lets to correct a field curvature.

4. The apparatus as in claim 2, wherein the addressable deflector and the aberration correcting deflector are disposed in conjugate planes.

5. The apparatus as in claim 2, wherein the addressable deflector and the aberration correcting deflector are embodied in a single array of apertures and associated electrodes.

6. The apparatus as in claim 2, wherein the aberration correcting deflector is configured and arranged to controllably displace the beam lets in a radial direction to correct aberrations.

7. The apparatus as in claim 3, wherein the micro lens array is configured and arranged to controllably displace the beam lets in a focus direction to correct the field curvature.

8. The apparatus as in claim 1, further comprising a movable stage configured to hold the substrate during the inspecting.

9. The apparatus as in claim 8, wherein the movable stage is configured to move the substrate relative to the beamlets during the inspecting.

10. The apparatus as in claim 1, wherein the addressable deflector has independently addressable electrodes comprising:

an array of apertures configured to allow passage of an electron beam therethrough;

an array of electrodes, each electrode of the array positioned proximate a respective aperture, the electrodes configured and arranged to, when energized, produce an electric field for steering the electron beam passing through the [aperture] *array of apertures*;

a first set of electrical leads extending in a first direction across the array of electrodes, the first set of electrical leads being in electrical communication with an array of switches, the switches being controllable by energizing leads of the first set of electrical leads; and a second set of electrical leads extending in a second direction across the array of electrodes different from the first direction, the second set of electrical leads being in electrical communication with the array of switches, such that when the switches are opened in response to energizing leads of the first set of electrical leads, charge from a respective one of the second set of electrical leads is allowed to flow to charge a selected electrode of the array of electrodes.

11. The apparatus as in claim 10, wherein the second set of electrical leads is configured to provide a potential to the selected electrode of between 100V and 400V.

12. A method of inspecting a substrate having a pattern [imaged] thereon, the method comprising:

obtaining a plurality of selected target locations on the substrate;

scanning the substrate with a plurality of electron beamlets, wherein the scanning comprises individually addressing, using an addressable deflector, the beam lets to impinge on the selected target locations independently such that at least one beamlet has its pitch changed with respect to its nearest neighbors when emitted from the addressable deflector for generating an irregular grid *arrangement of the beamlets at impingement* on the surface of the substrate; and detecting reflected, transmitted, or secondary electrons of the beam lets and generating images of the selected target locations.

13. The method as in claim 12, wherein the selected target locations are selected on the basis of a measure of criticality, and/or wherein the selected target locations are selected dependent on characteristics of the pattern.

14. The method as in claim 12, wherein the scanning comprises individually deflecting each beamlet independently using an array of individually addressable electrodes of the addressable deflector.

15. A computing device including memory and at least one processor, the at least one processor being operable to control an inspection device to at least:

obtain a plurality of selected target locations on a substrate;

scan the substrate with a plurality of electron beam lets, wherein the scanning comprises individual addressing, using an addressable deflector, of the beamlets to impinge on the selected target locations independently such that at least one beam let has its pitch changed with respect to its nearest neighbors when emitted from the addressable deflector for generating an irregular grid *arrangement of the beamlets at impingement* on the surface of the substrate; and detect reflected, transmitted, or secondary electrons of the beam lets and generate images of the selected target locations.

16. The computing device of claim 15, wherein the at least one processor is configured to select target locations on the basis of a measure of criticality, and/or dependent on characteristics of a pattern on the substrate.

17. The computing device of claim 15, wherein the scanning comprises individual deflection of each beam let independently using an array of individually addressable electrodes of the addressable deflector.

18. The computing device of claim 15, wherein the at least one processor is further operable to control the inspection device to controllably displace the beam lets to correct aberrations.

19. The computing device of claim 15, wherein the at least one processor is further operable to control the inspection device to controllably displace the beam lets to correct a field curvature.

20. The computing device of claim 15, wherein the at least one processor is further operable to control the inspection device to move the substrate relative to the beam lets during the inspecting.

*21. An apparatus configured to direct charged particles towards an object, the apparatus comprising:*

*an addressable deflector configured and arranged to independently displace each beamlet of a plurality of beamlets of charged particles to impinge on a selected target location on the object; and*

*instructions, when executed by at least one processor, programmed to control, or cause control of, the addressable deflector such that at least one beamlet has its pitch changed with respect to its nearest neighbors when emitted from the addressable deflector for generating an irregular grid arrangement of the beamlets at impingement on a surface of the object.*

*22. The apparatus of claim 21, further comprising:*

*(i) a source configured to generate the charged particles; or*

*(ii) a condenser lens; or*

*(iii) a scan deflector configured and arranged to displace the beamlets to scan the surface of the object; or*

*(iv) an objective lens configured and arranged to focus the beamlets onto the surface of the object; or*

*(v) any combination selected from (i)-(iv).*

*23. The apparatus of claim 21, wherein the addressable deflector has independently addressable electrodes comprising:*

*an array of apertures configured to allow passage of a charged particle beam therethrough;*

*an array of electrodes, each electrode of the array positioned proximate a respective aperture, the electrodes configured and arranged to, when energized, produce an electric field for steering the charged particles passing through the array of apertures;*

*a first set of electrical leads extending in a first direction across the array of electrodes, the first set of electrical leads being in electrical communication with an array of switches, the switches being controllable by energizing leads of the first set of electrical leads; and*

*a second set of electrical leads extending in a second direction across the array of electrodes different from the first direction, the second set of electrical leads being in electrical communication with the array of switches, such that when the switches are opened in response to energizing leads of the first set of electrical leads, charge from a respective one of the second set of electrical leads is allowed to flow to charge a selected electrode of the array of electrodes.*

* * * * *